US010816708B2

(12) United States Patent
Iida

(10) Patent No.: US 10,816,708 B2
(45) Date of Patent: Oct. 27, 2020

(54) POLARIZING PLATE HAVING OPTICAL COMPENSATION LAYER, AND ORGANIC EL PANEL USING SAME

(71) Applicant: NITTO DENKO CORPORATION, Ibaraki-shi, Osaka (JP)

(72) Inventor: Toshiyuki Iida, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 232 days.

(21) Appl. No.: 15/755,843

(22) PCT Filed: Aug. 10, 2016

(86) PCT No.: PCT/JP2016/073517
§ 371 (c)(1),
(2) Date: Feb. 27, 2018

(87) PCT Pub. No.: WO2017/038415
PCT Pub. Date: Mar. 9, 2017

(65) Prior Publication Data
US 2018/0329124 A1    Nov. 15, 2018

(30) Foreign Application Priority Data

Aug. 31, 2015   (JP) .................................. 2015-171244

(51) Int. Cl.
*G02B 5/30*      (2006.01)
*G02B 27/28*     (2006.01)
(Continued)

(52) U.S. Cl.
CPC .............. *G02B 5/3016* (2013.01); *B32B 7/02* (2013.01); *G02B 5/30* (2013.01); *G02B 5/3083* (2013.01); *H01L 51/5293* (2013.01)

(58) Field of Classification Search
CPC .... G02B 5/3083; G02B 5/3033; G02B 5/305; G02B 5/3016; G02B 5/3025; G02B 5/32;
(Continued)

(56) References Cited

U.S. PATENT DOCUMENTS 4,208,267 A * 6/1980 Diefendorf ............... C10C 3/00
208/22
4,209,500 A * 6/1980 Chwastiak ............. C10C 3/002
208/22

(Continued)

FOREIGN PATENT DOCUMENTS

CN       104170525 A    11/2014
CN       104350399 A    2/2015
(Continued)

OTHER PUBLICATIONS

Third Party Observation dated Mar. 19, 2019, issued in counterpart JP Application No. 2018-036168, with English translation (46 pages).
(Continued)

*Primary Examiner* — William R Alexander
*Assistant Examiner* — Tamara Y. Washington
(74) *Attorney, Agent, or Firm* — Westerman, Hattori, Daniels & Adrian, LLP

(57) ABSTRACT

There is provided a polarizing plate with optical compensation layers that achieves an excellent reflection hue and viewing angle characteristic, and has an excellent mechanical strength. The polarizing plate with optical compensation layers includes a polarizer, an optically anisotropic layer, a first optical compensation layer, and a second optical compensation layer in this order. The optically anisotropic layer shows a refractive index characteristic of nx≥ny>nz, and has an Re(550) of from 0 nm to 20 nm and an Rth(550) of from 5 nm to 100 nm. The first optical compensation layer shows
(Continued)

a refractive index characteristic of nx>ny≥nz, and satisfies a relationship of Re(450)<Re(550). The second optical compensation layer shows a refractive index characteristic of nz>nx≥ny. A laminate of the first optical compensation layer and the second optical compensation layer has an Re(550) of from 120 nm to 160 nm and an Rth(550) of from −50 nm to 80 nm.

20 Claims, 1 Drawing Sheet

(51) Int. Cl.
  *H01L 51/52* (2006.01)
  *B32B 7/02* (2019.01)
  *B23B 7/02* (2006.01)
(58) Field of Classification Search
  CPC .... G02B 1/04; G02B 1/08; C08L 1/12; C08L 1/14; C08L 67/02; B32B 2457/20; B32B 2457/202; G02F 1/13363; G02F 1/133528; G02F 1/133634; G02F 1/133637; G02F 2001/133638
  USPC ..................................................... 359/489.07
  See application file for complete search history.

(56) References Cited

U.S. PATENT DOCUMENTS

| | | | | |
|---|---|---|---|---|
| 4,228,355 | A * | 10/1980 | Wakayama | G01T 1/185 250/374 |
| 4,601,813 | A * | 7/1986 | Izumi | D01F 9/155 208/22 |
| 4,655,902 | A * | 4/1987 | Izumi | D01F 9/155 208/22 |
| 5,188,894 | A * | 2/1993 | Yamada | D01F 8/18 264/211.11 |
| 5,360,672 | A * | 11/1994 | Saito | B29C 55/18 264/138 |
| 5,579,396 | A * | 11/1996 | Iida | H04S 1/002 381/18 |
| 5,721,308 | A * | 2/1998 | Yamamoto | D01F 9/145 423/447.2 |
| 5,761,315 | A * | 6/1998 | Iida | H04S 7/302 381/1 |
| 5,844,993 | A * | 12/1998 | IIda | H04S 3/00 381/18 |
| 6,565,974 | B1 | 5/2003 | Uchiyama et al. | |
| 7,538,836 | B2 | 5/2009 | Fujita et al. | |
| 7,557,883 | B2 | 7/2009 | Kawamoto et al. | |
| 8,962,072 | B2 | 2/2015 | Toyama et al. | |
| 9,128,322 | B2 | 9/2015 | Saitoh et al. | |
| 9,164,213 | B2 | 10/2015 | Yaginuma et al. | |
| 9,383,492 | B2 | 7/2016 | Hatanaka et al. | |
| 9,394,415 | B2 | 7/2016 | Hojo | |
| 9,529,130 | B2 | 12/2016 | Hatanaka et al. | |
| 9,541,691 | B2 | 1/2017 | Hatanaka et al. | |
| 9,588,271 | B2 | 3/2017 | Yamada et al. | |
| 9,696,475 | B2 | 7/2017 | Hatanaka et al. | |
| 9,939,554 | B2 | 4/2018 | Wang et al. | |
| 10,036,840 | B2 | 7/2018 | Takeda et al. | |
| 10,139,540 | B2 | 11/2018 | Hatanaka et al. | |
| 2005/0231660 | A1 | 10/2005 | Fujita et al. | |
| 2006/0203162 | A1 | 9/2006 | Ito et al. | |
| 2008/0049179 | A1 | 2/2008 | Kawamoto et al. | |
| 2009/0046224 | A1 * | 2/2009 | Iida | G02F 1/133528 349/96 |
| 2009/0046228 | A1 * | 2/2009 | Takeda | G02B 5/3033 349/118 |
| 2009/0109385 | A1 * | 4/2009 | Nagase | G02B 5/30 349/119 |
| 2010/0249323 | A1 * | 9/2010 | Iida | B29C 41/28 525/119 |
| 2010/0265579 | A1 * | 10/2010 | Iida | C08J 5/18 359/485.01 |
| 2010/0321780 | A1 * | 12/2010 | Kawasaki | G02B 5/3083 359/489.01 |
| 2011/0287224 | A1 * | 11/2011 | Shirafuji | B29C 55/08 428/156 |
| 2012/0003402 | A1 | 1/2012 | Ohashi et al. | |
| 2013/0171371 | A1 | 7/2013 | Toyama et al. | |
| 2014/0042944 | A1 | 2/2014 | Pettigrew et al. | |
| 2014/0205822 | A1 | 7/2014 | Wang et al. | |
| 2014/0284583 | A1 | 9/2014 | Saitoh et al. | |
| 2014/0327837 | A1 | 11/2014 | Osterman et al. | |
| 2014/0375935 | A1 | 12/2014 | Yamada et al. | |
| 2015/0042941 | A1 | 2/2015 | Hatanaka et al. | |
| 2015/0042942 | A1 | 2/2015 | Hatanaka et al. | |
| 2015/0042943 | A1 | 2/2015 | Hatanaka et al. | |
| 2015/0042944 | A1 | 2/2015 | Hatanaka et al. | |
| 2015/0043071 | A1 | 2/2015 | Hatanaka et al. | |
| 2015/0049291 | A1 | 2/2015 | Hatanaka et al. | |
| 2015/0168624 | A1 | 6/2015 | Yaginuma et al. | |
| 2015/0284522 | A1 | 10/2015 | Hojo | |
| 2015/0369981 | A1 | 12/2015 | Takeda et al. | |
| 2016/0274400 | A1 * | 9/2016 | Iida | G02F 1/133634 |
| 2016/0291373 | A1 * | 10/2016 | Iida | G02F 1/13363 |
| 2018/0356679 | A1 * | 12/2018 | Iida | G02B 5/30 |

FOREIGN PATENT DOCUMENTS

| | | |
|---|---|---|
| JP | 2000-352620 A | 12/2000 |
| JP | 3325560 B2 | 9/2002 |
| JP | 2005-326818 A | 11/2005 |
| JP | 2006-84700 A | 3/2006 |
| JP | 2006-251050 A | 9/2006 |
| JP | 2007-334085 A | 12/2007 |
| JP | 2008-40487 A | 2/2008 |
| JP | 2010-243903 A | 10/2010 |
| JP | 2014-26266 A | 2/2014 |
| JP | 2014-157285 A | 8/2014 |
| JP | 2014-167922 A | 9/2014 |
| JP | 2014-170221 A | 9/2014 |
| JP | 2014167922 A * | 9/2014 |
| JP | 2014-209219 A | 11/2014 |
| JP | 2014-214177 A | 11/2014 |
| JP | 2015-163936 A | 9/2015 |
| JP | 2015-163938 A | 9/2015 |
| JP | 2015-187717 A | 10/2015 |
| JP | 2016-511839 A | 4/2016 |
| TW | 201407209 A | 2/2014 |
| WO | 2006/090700 A1 | 8/2006 |
| WO | 2012/086466 A1 | 6/2012 |
| WO | 2013/137464 A1 | 9/2013 |
| WO | 2014/073020 A1 | 5/2014 |
| WO | 2017/012291 A1 | 1/2017 |
| WO | 2017/074163 A1 | 5/2017 |

OTHER PUBLICATIONS

Tanaka, Kazushi, "Reality and Future Prospect of Display Related Market", Fuji Chimera Research Institute, Inc., 2012, vol. 2, with English translation, Cited in Third Party Observation dated Mar. 19, 2019 (14 pages).
International Search Report dated Nov. 15, 2016, issued in counterpart International Application No. PCT/JP2016/073517 (3 pages).
Explanation of Circumstances Concerning Accelerated Examination dated Apr. 3, 2018, filed in counterpart Japanese Application No. 2018-36168, with English translation. (25 pages).
Explanation of Circumstances Concerning Accelerated Examination dated Sep. 26, 2017, filed in counterpart Japanese Application No. 2015-171244, with English translation. (30 pages).
Office Action dated Nov. 22, 2017, issued in counterpart Japanese Application No. 2015-171244, with English translation. (16 pages).
Office Action dated May 12, 2020, issued in counterpart JP Application No. 2019-005187, with English translation.
Office Action dated Dec. 23, 2019, issued in counterpart CN Application No. 201680047303.6, with English translation. (20 Pages).

(56) References Cited

OTHER PUBLICATIONS

Office Action dated Dec. 19, 2019, issued in counterpart TW Application No. 105127368, with English translation. (6 pages).

* cited by examiner

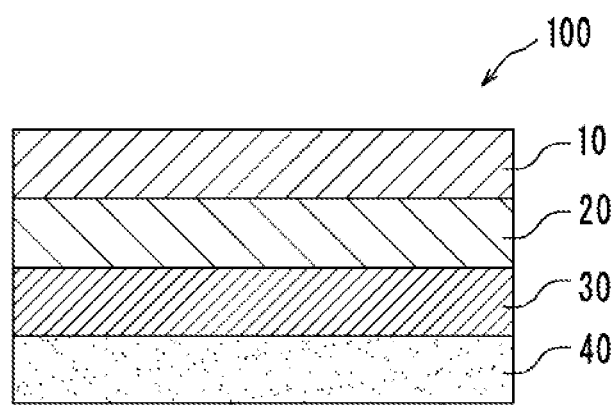

POLARIZING PLATE HAVING OPTICAL COMPENSATION LAYER, AND ORGANIC EL PANEL USING SAME

TECHNICAL FIELD

The present invention relates to a polarizing plate with optical compensation layers and an organic EL panel using the same.

BACKGROUND ART

In recent years, along with widespread use of thin displays, a display having an organic EL panel mounted thereon (organic EL display apparatus) has been proposed. The organic EL panel has a metal layer having high reflectivity, and hence is liable to cause a problem of, for example, reflection of ambient light or reflection of a background. In view of the foregoing, it has been known that such problem is prevented by arranging a circularly polarizing plate on a viewer side. As a general circularly polarizing plate, there is known one in which a retardation film (typically a λ/4 plate) is laminated so that its slow axis forms an angle of about 45° with respect to an absorption axis of a polarizer. The circularly polarizing plate typically includes, on one side or each of both sides of a polarizer, a protective film for protecting the polarizer. In this case, when an inner (organic EL cell-side) protective film has optical anisotropy, an antireflection characteristic of the circularly polarizing plate is adversely influenced in many cases. Meanwhile, when an attempt is made to configure the inner protective film to be optically isotropic in order to avoid such adverse influence, its mechanical characteristics (e.g., strength and smoothness) become insufficient, resulting in insufficient mechanical characteristics of the circularly polarizing plate in many cases. As can be seen from the foregoing, there is a strong demand for a circularly polarizing plate capable of simultaneously satisfying an excellent antireflection characteristic and an excellent mechanical strength.

CITATION LIST

Patent Literature

[PTL 1] JP 3325560 B2

SUMMARY OF INVENTION

Technical Problem

The present invention has been made to solve the problem of the related art described above, and a primary object of the present invention is to provide a polarizing plate with optical compensation layers that achieves an excellent reflection hue and viewing angle characteristic, and has an excellent mechanical strength.

Solution to Problem

According to one aspect of the present invention, a polarizing plate with optical compensation layers is provided. The polarizing plate with optical compensation layers is used or an organic EL panel, and includes a polarizer, an optically anisotropic layer, a first optical compensation layer, and a second optical compensation layer in this order. The optically anisotropic layer shows a refractive index characteristic of $nx \geq ny > nz$, and has an Re(550) of from 0 nm to 20 nm and an Rth(550) of from 5 nm to 100 nm; the first optical compensation layer shows a refractive index characteristic of $nx > ny \geq nz$, and satisfies a relationship of $Re(450) < Re(550)$; the second optical compensation layer shows a refractive index characteristic of $nz > nx \geq ny$; a laminate of the first optical compensation layer and the second optical compensation layer has an Re(550) of from 120 nm to 160 nm and an Rth(550) of from −50 nm to 80 nm. Re(450) represents an in-plane retardation measured with light having a wavelength of 450 nm at 23° C., Re(550) represents an in-plane retardation measured with light having a wavelength of 550 nm at 23° C., and Rth(550) represents a thickness direction retardation measured with light having a wavelength of 550 nm at 23° C.

In one embodiment of the invention, the optically anisotropic layer has a tensile strength of from 100 N/mm$^2$ to 300 N/mm$^2$.

In one embodiment of the invention, an angle formed by an absorption axis of the polarizer and a slow axis of the first optical compensation layer is from 35° to 55°.

In one embodiment of the invention, the first optical compensation layer includes a retardation film obtained by oblique stretching.

In one embodiment of the invention, the polarizing plate with optical compensation layers further includes at conductive layer and a substrate in the stated order on an opposite side of the second optical compensation layer to the first optical compensation layer.

According to another aspect of the present invention, there is provided an organic EL panel. The organic EL panel includes the polarizing plate with optical compensation layers.

Advantageous Effects of Invention

According to the present invention, in the polarizing plate with optical compensation layers, the optically anisotropic layer, which may also function as an inner protective film for the polarizer, is arranged, and the in-plane retardation and thickness direction retardation of the laminate of the first optical compensation layer and the second optical compensation layer each having a predetermined refractive index characteristic are optimized within predetermined ranges. Thus, the polarizing plate with optical compensation layers that achieves an excellent reflection hue and viewing angle characteristic, and has an excellent mechanical strength can be obtained.

BRIEF DESCRIPTION OF DRAWINGS

FIG. 1 is a schematic sectional view of a polarizing plate with optical compensation layers according to one embodiment of the present invention.

DESCRIPTION OF EMBODIMENTS

Now, preferred embodiments of the present invention are described. However, the present invention is not limited to these embodiments.

(Definitions of Terms and Symbols)

The definitions of terms and symbols used herein are as follows.

(1) Refractive Indices (nx, ny, and nz)

A symbol "nx" represents a refractive index in a direction in which an in-plane refractive index is maximum (that is, slow axis direction), "ny" represents a refractive index in a direction perpendicular to the slow axis in the plane (that is, fast axis direction), and "nz" represents a refractive index in a thickness direction.

(2) In-Plane Retardation (Re)

The term "Re(λ)" refers to the in-plane retardation of a film measured at 23° C. with light having a wavelength of λ nm. The Re(λ) is determined from the equation "Re=(nx−ny)×d" when the thickness of the film is represented by d (nm). For example, the term "Re(550)" refers to the in-plane retardation of the film measured at 23° C. with light having a wavelength of 550 nm.

(3) Thickness Direction Retardation (Rth)

The term "Rth(λ)" refers to the thickness direction retardation of the film measured at 23° C. with light having a wavelength of λ nm. The Rth(λ) is determined from the equation "Rth=(nx−nz)×d" when the thickness of the film is represented by d (nm). For example, the terra "Rth(550)" refers to the thickness direction retardation of the film measured at 23° C. with light having a wavelength of 550 nm.

(4) Nz Coefficient

An Nz coefficient is determined from the equation "Nz=Rth/Re".

(5) Substantially Perpendicular or Parallel

The expressions "substantially perpendicular" and "approximately perpendicular" include a case where an angle formed by two directions is 90°±10°, preferably 90°±7°, more preferably 90°±5°. The expressions "substantially parallel" and "approximately parallel" include a case where an angle formed by two directions is 0°±10°, preferably 0°±7°, more preferably 0°±5°. Moreover, in this specification, such a simple expression "perpendicular" or "parallel" can include a substantially perpendicular state or a substantially parallel state.

A. Overall Configuration of Polarizing Plate With Optical Compensation Layers

FIG. 1 is a schematic sectional view of a polarizing plate with optical compensation layers according to one embodiment of the present invention. A polarizing plate 100 with optical compensation layers according to this embodiment includes a polarizer 10, an optically anisotropic layer 20, a first optical compensation layer 30, and a second optical compensation layer 40 in the stated order. In the illustrated example, the first optical compensation layer 30 is arranged on the polarizer 10 side with respect to the second optical compensation layer 40, but the second optical compensation layer 40 may be arranged on the polarizer 10 side. In this embodiment, the optically anisotropic layer 20 may also function as a protective layer for the polarizer 10. As required, a protective layer (not shown) may be arranged on the opposite side of the polarizer 10 to the optically anisotropic layer 20. Further, as required, a conductive layer and a substrate may be arranged in the stated order (none of which is shown) on the opposite side of the second optical compensation layer 40 to the first optical compensation layer 30 (that is, the outside of the second optical compensation layer 40). The substrate is closely laminated on the conductive layer. The term "closely laminated" as used herein means that two layers are directly and fixedly laminated without the intermediation of an adhesion layer (e.g., an adhesive layer or a pressure-sensitive adhesive layer). The conductive layer and the substrate may be typically introduced as a laminate of the substrate and the conductive layer into the polarizing plate 100 with optical compensation layers. When the conductive layer and the substrate are further arranged, the polarizing plate 100 with optical compensation layers can be suitably used for an inner touch panel-type input display apparatus.

The first optical compensation layer 30 has a refractive index characteristic of showing a relationship of nx>ny≥nz, and has a slow axis. The polarizer 10 and the first optical compensation layer 30 are laminated so that the absorption axis of the polarizer 10 and the slow axis of the first optical compensation layer 30 form a predetermined angle. The angle formed by the absorption axis of the polarizer 10 and the slow axis of the first optical compensation layer 30 is preferably from 35° to 55°, more preferably from 38° to 52°, still more preferably from 42° to 48°, particularly preferably about 45°. When the angle falls within such range, an excellent antireflection function can be achieved.

The polarizing plate with optical compensation layers may have a sheet shape, or may have an elongate shape.

Now, the constituent layers of the polarizing plate with optical compensation layers and an optical film, are described in detail.

A-1. Polarizer

Any appropriate polarizer may be adopted as the polarizer 10. For example, a resin film for forming the polarizer may be a single-layer resin film, or may be a laminate of two or more layers.

Specific examples of the polarizer including a single-layer resin film include: a polarizer obtained by subjecting a hydrophilic polymer film, such as a polyvinyl alcohol (PVA)-based film, a partially formalized PVA-based film, or an ethylene-vinyl acetate copolymer-based partially saponified film, to dyeing treatment with a dichromatic substance, such as iodine or a dichromatic dye, and stretching treatment; and a polyene-based alignment film, such as a dehydration-treated product of PVA or a dehydrochlorination-treated product of polyvinyl chloride. A polarizer obtained by dyeing the PVA-based film with iodine and uniaxially stretching the resultant is preferably used because the polarizer is excellent in optical characteristics.

The dyeing with iodine is performed by, for example, immersing the PVA-based film in an aqueous solution of iodine. The stretching ratio of the uniaxial stretching is preferably from 3 times to 7 times. The stretching may be performed after the dyeing treatment, or may be performed while the dyeing is performed. In addition, the dyeing may be performed after the stretching has been performed. The PVA-based film is subjected to swelling treatment, cross-linking treatment, washing treatment, drying treatment, or the like as required. For example, when the PVA-based film is immersed in water to be washed with water before the dyeing, contamination or an antiblocking agent on the surface of the PVA-based film can be washed off. In addition, the PVA-based film is swollen and hence dyeing unevenness or the like can be prevented.

The polarizer obtained by using the laminate is specifically, for example, a polarizer obtained by using a laminate Of a resin substrate and a PVA-based resin layer (PVA-based resin film) laminated on the resin substrate, or a laminate of a resin substrate and a PVA-based resin layer formed on the resin substrate through application. The polarizer obtained by using the laminate of the resin substrate and the PVA-based resin layer formed on the resin substrate through application may be produced by, for example, a method involving: applying a PVA-based resin solution onto the resin substrate; drying the solution to form the PVA-based resin layer on the resin substrate, thereby providing the laminate of the resin substrate and the PVA-based resin layer; and stretching and dyeing the laminate to turn the PVA-based resin layer into the polarizer. In this embodiment, the stretching typically includes the stretching of the laminate under a state in which the laminate is immersed in an aqueous solution of boric acid. The stretching may further include the aerial stretching of the laminate at high temperature (e.g., 95° C. or more) before the stretching in the aqueous solution of boric acid as required. The resultant laminate of the resin substrate and the polarizer may be used as it is (i.e., the resin substrate maybe used as a protective layer for the polarizer). Alternatively, a product obtained as described below may be used: the resin substrate is peeled from the laminate of the resin substrate and the polarizer, and any appropriate protective layer in accordance with purposes is laminated on the peeling surface. Details of such method of producing a polarizer are disclosed in, for example, JP 2012-73580 A. The entire disclosure of the laid-open publication is incorporated herein by reference.

The thickness of the polarizer is preferably 25 µm or less, more preferably from 1 µm to 12 µm, still more preferably from 3 µm to 12 µm, particularly preferably from 3 µm to 8 µm. When the thickness of the polarizer falls within such range, curling at the time of heating can be satisfactorily suppressed, and satisfactory external appearance durability at the time of heating is obtained.

The polarizer preferably shows absorption dichroism at any wavelength in the wavelength range of from 380 nm to 780 nm. As described above, the single layer transmittance of the polarizer is from 43.0% to 46.0%, preferably from 44.5% to 46.0%. The polarization degree of the polarizer is preferably 97.0% or more, more preferably 99.0% or more, still more preferably 99.9% or more.

A-2. Optically Anisotropic Layer

The optically anisotropic layer 20 shows a refractive index characteristic of nx≥ny>nz. Therefore, the optically anisotropic layer may have a slow axis. In this case, the slow axis of the optically anisotropic layer is substantially perpendicular or parallel to the absorption axis of the polarizer.

The optically anisotropic layer has an Re(550) of from 0 nm to 20 nm and an Rth(550) of from 5 nm to 100 nm. When the in-plane retardation and the thickness direction retardation fall within such ranges, an excellent antireflection characteristic of a circularly polarizing plate with optical compensation layers to be obtained can be maintained by optimizing the optical characteristics of a laminate of the first optical compensation layer and the second optical compensation layer as described later. Simultaneously, a circularly polarizing plate with optical compensation layers having an excellent mechanical strength can be obtained. In one embodiment, the Re(550) of the optically anisotropic layer is preferably from 0 nm to 15 nm, more preferably from 0 nm to 10 nm. In this case, the Rth(550) of the optically anisotropic layer is preferably from 5 nm to 60 nm, more preferably from 10 nm to 20 nm. According to such embodiment, an extremely excellent reflection hue and viewing angle characteristic can be achieved, while an excellent mechanical strength is maintained, by optimizing the optical characteristics of the laminate of the first optical compensation layer and the second optical compensation layer as described later. In another embodiment, the Re(550) of the optically anisotropic layer is preferably from 10 nm to 20 nm, more preferably from 15 nm to 20 nm. In this case, the Rth(550) of the optically anisotropic layer is preferably from 30 nm to 70 nm, more preferably from 35 nm to 50 nm. According to such embodiment, an extremely excellent mechanical strength can be achieved while an acceptable antireflection characteristic is maintained.

The tensile strength of the optically anisotropic layer is preferably from 100 N/mm$^2$ to 300 N/mm$^2$, more preferably from 100 N/mm$^2$ to 200 N/mm$^2$. When the tensile strength falls within such range, a mechanical strength appropriate as a protective layer for a polarizer can be achieved with the in-plane retardation and thickness direction retardation as described above. The tensile strength may be measured in conformity to JIS K 7161.

The smoothness of the optically anisotropic layer may be expressed by, for example, using its arithmetic average roughness Ra as an index. The arithmetic average roughness Ra of the optically anisotropic layer is preferably from 0.001 µm to 0.1 µm, more preferably from 0.001 µm to 0.05 µm. When the smoothness falls within such range, retardation unevenness of the optically anisotropic layer can be reduced.

The optically anisotropic layer may be formed of any appropriate material as long as the optical characteristics and mechanical characteristics as described above are satisfied. A material for forming the optically anisotropic layer is specifically, for example: cellulose-based resins, such as triacetylcellulose (TAC); and polyester-based, polyvinyl alcohol-based, polycarbonate-based, polyamide-based, polyimide-based, polyether sulfone-based, polysulfone-based, polystyrene-based, polynorbornene-based, polyolefin-based, (meth)acrylic, and acetate-based transparent resins. Examples thereof also include (meth)acrylic, urethane-based, (meth)acrylic urethane-based, epoxy-based, and silicone-based thermosetting resins or UV-curable resins. Examples thereof still also include glassy polymers, such as a siloxane-based polymer. A polymer film described in JP 2001-343529 A (WO 01/37007 A1) may also be used. For example, a resin composition containing a thermoplastic resin having a substituted or unsubstituted imide group on a side chain thereof, and a thermoplastic resin having a substituted or unsubstituted phenyl group and a nitrile group on side chains thereof may be used as the material for the film, and the composition is, for example, a resin composition having an alternating copolymer formed of isobutene and N-methylmaleimide, and an acrylonitrile-styrene copolymer. The polymer film may be, for example, an extrudate of the resin composition. A film formed of any of the above-mentioned materials may be used as it is as the optically anisotropic layer, or the optically anisotropic layer may be formed by stretching the film.

The thickness of the optically anisotropic layer is preferably from 10 µm to 80 µm, more preferably from 15 µm to 40 µm. With such thickness, the desired in-plane retardation and thickness direction retardation, and the desired mechanical strength can be achieved.

A-3. First Optical Compensation Layer

As described above, the first optical compensation layer 30 has a refractive index characteristic of shoving a relationship of nx>ny≥nz. The in-plane retardation Re(550) of the first optical compensation layer is preferably from 80 nm to 200 nm, more preferably from 100 nm to 180 nm, still more preferably from 110 nm to 170 nm. When the in-plane retardation of the first optical compensation layer falls within such range, an excellent antireflection function can be achieved by setting the slow axis direction of the first optical compensation layer so as to form an angle of from 35° to 55° (in particular, about 45°) as described above with respect to the absorption axis direction of the polarizer.

The first optical compensation layer shows the so-called reverse wavelength dispersion dependency. Specifically, its in-plane retardations satisfy a relationship of Re(450)<Re(550). When such relationship is satisfied, an excellent reflection hue can be achieved. A ratio Re(450)/Re(550) is preferably 0.8 or more and less than 1, more preferably 0.8 or more and 0.95 or less.

The Nz coefficient of the first optical compensation layer is preferably from 1 to 3, more preferably from 1 to 2.5, still more preferably from 1 to 1.5, particularly preferably from 1 to 1.3. When such relationship is satisfied, a more excellent reflection hue can be achieved.

The first optical compensation layer has a water absorption ratio of preferably 3% or less, more preferably 2.5% or less, still more preferably 2% or less. When such water absorption ratio is satisfied, changes in display characteristics over time can be suppressed. The water absorption ratio may be determined in conformity to JIS K 7209.

The first optical compensation layer is typically a retardation film formed of any appropriate resin. A polycarbonate resin is preferably used as the resin for forcing the retardation film.

As the polycarbonate resin, any appropriate polycarbonate resin may be used as long as the effect of the present invention is obtained. The polycarbonate resin preferably contains: a structural unit derived from a fluorene-based dihydroxy compound; a structural unit derived from an isosorbide-based dihydroxy compound; and a structural unit derived from at least one dihydroxy compound selected from the group consisting of an alicyclic diol, an alicyclic dimethanol, di-, tri-, or polyethylene glycol, and an alkylene glycol or spiroglycol. The polycarbonate resin more preferably contains: a structural unit derived from a fluorene-based dihydroxy compound; a structural unit derived from an isosorbide-based dihydroxy compound; and a structural unit derived from an alicyclic dimethanol and/or a structural unit derived from di-, tri-, or polyethylene glycol. The polycarbonate resin still more preferably contains: a structural unit derived from a fluorene-based dihydroxy compound; a structural unit derived from an isosorbide-based dihydroxy compound; and a structural unit derived from di-, tri-, or polyethylene glycol. The polycarbonate resin may contain a structural unit derived from any other dihydroxy compound as required. Details of the polycarbonate resin which may be suitably used in the present invention are disclosed in, for example, JP 2014-10291 A and JP 2014-26266 A. The disclosures of the laid-open publications are incorporated herein by reference.

The glass transition temperature of the polycarbonate resin is preferably 110° C. or more and 180° C. or less, more preferably 120° C. or more and 165° C. or less. When the glass transition temperature is excessively low, the heat resistance of the resin tends to deteriorate and hence the resin may cause a dimensional change after its forming into a film. In addition, the image quality of an organic EL panel to be obtained may deteriorate. When the glass transition temperature is excessively high, the forming stability of the resin at the time of its forming into a film may deteriorate. In addition, the transparency of the film may be impaired. The glass transition temperature is determined in conformity to JIS K 7121 (1987).

The molecular weight of the polycarbonate resin may be expressed as a reduced viscosity. The reduced viscosity is measured with an Ubbelohde viscometer at a temperature of 20.0° C.±0.1° C. after precise adjustment of a polycarbonate concentration to 0.6 g/dL through the use of methylene chloride as a solvent. The lower limit of the reduced viscosity is generally preferably 0.30 dL/g, more preferably 0.35 dL/g or more. The upper limit of the reduced viscosity is generally preferably 1.20 dL/g, more preferably 1.00 dL/g, still more preferably 0.80 dL/g. When the reduced viscosity is lower than the lower limit value, there may arise a problem of a reduction in mechanical strength of a formed article. Meanwhile, when the reduced viscosity is higher than the upper limit value, there may arise a problem in that flowability during forming is decreased to decrease productivity and formability.

The retardation film is typically produced by stretching a resin film in at least one direction.

Any appropriate method may be adopted as a method of forming the resin film. Examples thereof include a melt extrusion method (such as a T die molding method), a cast coating method (such as a casting method), a calendar molding method, a hot press method, a co-extrusion method, a co-melting method, multilayer extrusion, and an inflation molding method. Of those, a T die molding method, a casting method, and an inflation molding method are preferably used.

The thickness of the resin film (unstretched film) may be set to any appropriate value depending on, for example, the desired optical characteristics, and stretching conditions to be described later. The thickness is preferably from 50 μm to 300 μm.

Any appropriate stretching method and stretching conditions (such as a stretching temperature, a stretching ratio, and a stretching direction) may be adopted for the stretching. Specifically, one kind of various stretching methods, such as free-end stretching, fixed-end stretching, free-end shrinkage, and fixed-end shrinkage, may be employed alone, or two or more kinds thereof may be employed simultaneously or sequentially. With regard to the stretching direction, the stretching may be performed in various directions or dimensions, such as a horizontal direction, a vertical direction, a thickness direction, and a diagonal direction. When the glass transition temperature of the resin film is represented by Tg, the stretching temperature falls within a range of preferably from Tg−30° C. to Tg+60° C., more preferably from Tg−10° C. to Tg+50° C.

A retardation film having the desired optical characteristics (such as a refractive index characteristic, an in-plane retardation, and an Nz coefficient) can be obtained by appropriately selecting the stretching method and stretching conditions.

In one embodiment, the retardation film is produced by subjecting a resin film to uniaxial stretching or fixed-end uniaxial stretching. The fixed-end uniaxial stretching is specifically, for example, a method involving stretching the resin film in its widthwise direction (lateral direction) while running the film in its lengthwise direction. The stretching ratio is preferably from 1.1 times to 3.5 times.

In another embodiment, the retardation film is produced by continuously subjecting a resin film having an elongate shape to oblique stretching in the direction of the angle θ with respect to a lengthwise direction. When the oblique stretching is adopted, a stretched film having an elongate shape and having an alignment angle that is the angle θ with respect to the lengthwise direction of the film (having a slow axis in the direction of the angle θ) is obtained, and for example, roll-to-roll manufacture can be performed in its lamination with the polarizer, with the result that the manufacturing process can be simplified. The absorption axis of the polarizer is expressed in the lengthwise direction or widthwise direction of the elongate film due to its manufacturing method, and hence the angle θ may be the angle formed by the absorption axis of the polarizer and the slow axis of the first optical compensation layer.

As a stretching machine to be used for the oblique stretching, for example, there is given a tenter stretching machine capable of applying feeding forces, or tensile forces or take-up forces, having different speeds on left and right sides in a lateral direction and/or a longitudinal direction.

Examples of the tenter stretching machine include a lateral uniaxial stretching machine and a simultaneous biaxial stretching machine, and any appropriate stretching machine may be used as long as the resin film having an elongate shape can be continuously subjected to the oblique stretching.

The thickness of the retardation film (stretched film, i.e., first optical compensation layer) is preferably from 20 μm to 100 μm, more preferably from 20 μm to 80 μm, still more preferably from 20 μm to 65 μm. With such thickness, the above-mentioned desired in-plane retardation and thickness direction retardation can be obtained.

A-4. Second Optical Compensation Layer

As described above, the second optical compensation layer 40 has a refractive index characteristic of showing a relationship of nz>nx≥ny. The thickness direction retardation Rth(550) of the second optical compensation layer is preferably from −260 nm to −10 nm, more preferably from −230 nm to −15 nm, still more preferably from −215 nm to −20 nm. When the second optical compensation layer having such optical characteristics is arranged, a reflection hue as viewed from an oblique direction is remarkably improved, and as a result, a polarizing plate with optical compensation layers having an extremely excellent viewing angle characteristic can be obtained.

In one embodiment, the refractive indices of the second optical compensation layer show a relationship of nx=ny. Herein, "nx=ny" encompasses not only a case in which nx and ny are exactly equal to each other, but also a case in which nx and ny are substantially equal to each other. Specifically, "nx=ny" means an Re(550) of less than 10 nm. In another embodiment, the refractive indices of the second optical compensation layer show a relationship of nx>ny. Therefore, the second optical compensation layer may have a slow axis. The slow axis of the second optical compensation layer is substantially perpendicular or parallel to the absorption axis of the polarizer. In addition, the in-plane retardation Re(550) of the second optical compensation layer is preferably from 10 nm to 150 nm, more preferably from 10 nm to 80 nm.

The second optical compensation layer may be formed of any appropriate material. The second optical compensation layer is preferably a liquid crystal layer fixed in homeotropic alignment. A liquid crystal material (liquid crystal compound) that can be homeotropically aligned may be a liquid crystal monomer, or may be a liquid crystal polymer. Specific examples of the liquid crystal compound and a method of forming the liquid crystal layer include a liquid crystal compound and a forming method described in [0020] to [0042] of JP 2002-333642 A. In this case, the thickness of the second optical compensation layer is preferably from 0.1 μm to 5 μm, more preferably from 0.2 μm to 3 μm.

As another preferred specific example, the second optical compensation layer may be a retardation film formed of a fumaric acid diester-based resin disclosed in JP 2012-32784 A. In this case, the thickness of the second optical compensation layer is preferably from 5 μm to 80 μm, more, preferably from 10 μm to 50 μm.

A-5. Laminate

The in-plane retardation Re(550) of a laminate of the first optical compensation layer and the second optical compensation layer is from 120 nm to 160 nm, preferably from 130 nm to 150 nm. The thickness direction retardation Rth(550) of the laminate is from −40 nm to 80 nm, preferably from −20 nm to 50 nm. When the optical characteristics of the laminate are set as described above, the adverse influence of the use of the optically anisotropic layer as described above on the antireflection characteristic of the polarizing plate with optical compensation layers can be avoided. As a result, a polarizing plate with optical compensation layers that achieves an excellent reflection hue and viewing angle characteristic, and has an excellent mechanical strength can be obtained.

A-6. Protective Layer

The protective layer is formed of any appropriate film that may be used as a protective layer for a polarizer. The protective layer may be subjected to surface treatment, such as hard coat treatment, antireflection treatment, anti-sticking treatment, or antiglare treatment, as required. Further/alternatively, the protective layer may be subjected to treatment for improving viewability in the case of viewing through polarized sunglasses (typically imparting a circular (elliptical) polarization function or imparting an ultra-high retardation) as required. When such treatment is performed, even in the case of viewing a display screen through a polarizing lens, such as polarized sunglasses, excellent viewability can be achieved. Therefore, the polarizing plate with optical compensation layers can be suitably applied even to an image display apparatus that may be used outdoors. The thickness of the protective layer is typically 5 mm or less, preferably 1 mm or less, more preferably from 1 μm to 500 μm, still more preferably from 5 μm to 150 μm. When the surface treatment is performed, the thickness of the protective layer is a thickness including the thickness of a surface treatment layer.

A-7. Conductive Layer or Conductive Layer With Substrate

The conductive layer may be formed by forming a metallic oxide film on any appropriate substrate through any appropriate film forming method (e.g., a vacuum vapor deposition method, a sputtering method, a CVD method, an ion plating method, and a spraying method). After the film formation, heating treatment (e.g., at from 100° C. to 200° C.) may be performed as required. When the heating treatment is performed, an amorphous film can be crystallized. Examples of the metal oxide include indium oxide, tin oxide, zinc oxide, indium-tin composite oxide, tin-antimony composite oxide, zinc-aluminum composite oxide, and indium-zinc composite oxide. An indium oxide may be doped with a divalent metal ion or a tetravalent metal ion. The metal oxide is preferably an indium-based complex oxide, more preferably an indium-tin complex oxide (ITO). The indium-based complex oxide has features of having a high transmittance (e.g., 80% or more) in a visible light region (380 nm to 780 nm) and having a low surface resistance value per unit area.

When the conductive layer contains the metal oxide, the thickness of the conductive layer is preferably 50 nm or less, more preferably 35 nm or less. The lower limit of the thickness of the conductive layer is preferably 10 nm.

The surface resistance value of the conductive layer is preferably 300 ohms per square (Ω/□) or less, more preferably 150 Ω/□ or less, still more preferably 100 Ω/□ or less.

The conductive layer may be used alone as a constituent layer of the polarizing plate with optical compensation layers by transferring the conductive layer from the substrate onto the second optical compensation layer, or maybe laminated on the second optical compensation layer as a laminate with the substrate (conductive layer with a substrate). As described above, the conductive layer and the substrate may be typically introduced as a conductive layer with a substrate into the polarizing plate with optical compensation layers.

A material for forming the substrate is, for example, any appropriate resin. The material is preferably a resin excellent in transparency. Specific examples thereof include a cyclic olefin-based resin, a polycarbonate-based resin, a cellulose-based resin, a polyester-based resin, and an acrylic resin.

The substrate is preferably optically isotropic, and therefore, the conductive layer may be used as a conductive layer with an isotropic substrate for the polarizing plate with optical compensation layers. As a material for forming the substrate that is optically isotropic (isotropic substrate), for example, there are given a material containing, as a main skeleton, a resin having no conjugated system, such as a norbornene-based resin or an olefin-based resin, and a material having a cyclic structure, such as a lactone ring or a glutarimide ring, in a main chain of an acrylic resin. The use of such material can suppress and reduce the expression of a retardation caused by the alignment of molecular chains when the isotropic substrate is formed.

The thickness of the substrate is preferably from 10 μm to 200 μm, more preferably from 20 μm to 60 μm.

A-8. Others

Any appropriate pressure-sensitive adhesive layer or adhesive layer is used for the lamination of each constituent layer of the polarizing plate with optical compensation layers of the present invention. The pressure-sensitive adhesive layer is typically formed of an acrylic pressure-sensitive adhesive. The adhesive layer is typically formed of a polyvinyl alcohol-based adhesive.

A pressure-sensitive adhesive layer (not shown) may be arranged on the second optical compensation layer 40 side (when the conductive layer and the substrate are arranged, the substrate side) of the polarizing plate 100 with optical compensation layers. When the pressure-sensitive adhesive layer is arranged in advance, the polarizing plate 100 with optical compensation layers can be easily bonded onto another optical member (e.g., an organic EL cell). It is preferred that a release film be attached onto the surface of the pressure-sensitive adhesive layer until use.

B. Manufacturing Method

Any appropriate method may be adopted as a manufacturing method for the polarizing plate with optical compensation layers. In one embodiment, the polarizing plate with optical compensation layers may be manufactured by a method including the steps of: laminating an elongate polarizer having an absorption axis in its lengthwise direction, an elongate resin film constituting the optically anisotropic layer, and an elongate retardation film constituting the first optical compensation layer so as to align their lengthwise directions with each other, while conveying each of the polarizer and the films in its lengthwise direction, to thereby obtain a laminated film; and forming the second optical compensation layer on the first optical compensation layer surface of the laminated film by application while conveying the laminated film. The polarizer, the optically anisotropic layer, and the first optical compensation layer may be simultaneously laminated, the polarizer and the optically anisotropic layer may be first laminated, or the optically anisotropic layer and the first optical compensation layer may be first laminated. In addition, a laminate of the first optical compensation layer and the second optical compensation layer may be formed in advance, and the laminate may be subjected to the above-mentioned laminating. In this connection, as described above, the angle formed by the absorption axis of the polarizer 10 and the slow axis of the first optical compensation layer 30 is preferably from 35° to 55°, more preferably from 38° to 52°, still more preferably from 42° to 48°, particularly preferably about 45°.

In this embodiment, the elongate retardation film constituting the first optical compensation layer has a slow axis in a direction at an angle θ with respect to its lengthwise direction. The angle θ may be the angle formed by the absorption axis of the polarizer and the slow axis of the first optical compensation layer as described above. Such retardation film may be obtained by oblique stretching. According to such configuration, as described above, a roll-to-roll process can be adopted in the manufacture of the polarizing plate with optical compensation layers, and hence the manufacturing process can be markedly shortened.

C. Organic EL Panel

An organic EL panel of the present invention includes an organic EL cell and the polarizing plate with optical compensation layers described in the section A, which is arranged on the viewer side of the organic EL cell. The polarizing plate with optical compensation layers is laminated so that the second optical compensation layer is arranged on an organic EL cell side (so that the polarizer is arranged on the viewer side).

EXAMPLES

Now, the present invention is specifically described by way of Examples. However, the present invention is not limited by these Examples. Measurement methods for characteristics are as described below.

(1) Thickness

Measurement was performed with a dial gauge (manufactured by PEACOCK, product name: "DG-205", dial, gauge stand (product name: "pds-2")).

(2) Retardations

A sample measuring 50 mm by 50 mm was cut out of each optical compensation layer and an optically anisotropic layer and was used as a measurement sample, and measurement was performed with Axoscan manufactured by Axometrics. Measurement wavelengths were 450 nm and 550 nm, and a measurement temperature was 23° C.

In addition, average refractive indices were measured with an Abbe refractometer manufactured by Atago Co., Ltd., and refractive indices nx, ny, and nz were calculated from the resultant retardation values.

(3) Water Absorption Ratio

Measurement was performed in conformity to "Test Methods for Water Absorption and Boiling Water Absorption of Plastics" described in JIS K 7209. The size of a test piece was a square of 50 mm side, the test piece was immersed in water having a water temperature of 25° C. for 24 hours, and then a weight change before and after the water immersion was measured to determine a water absorption ratio. The unit is %.

(4) Tensile Strength

The optically anisotropic layer was measured for its tensile strength in conformity to "Plastics—Determination of Tensile Properties" described in JIS K 7161.

(5) Smoothness

The optically anisotropic layer was measured for its arithmetic average roughness Ra with an optical interferometric microscope "WYKO NT-3300" (manufactured by Veeco).

(6) Reflection Hue and Viewing Angle Characteristic

The resultant organic EL panel was caused to display a black image and its reflection hue was measured with a viewing angle-measuring/evaluating apparatus CONOSCOPE manufactured by Auoronic-MERCHERS. A "viewing angle characteristic" shows a point-to-point distance Δxy between a reflection hue in a front direction and a reflection hue in an oblique direction (the maximum or minimum at a polar angle of 45°) in the xy chromaticity diagram of a CIE colorimetric system. When the Δxy is less than 0.15, the viewing angle characteristic is evaluated as satisfactory.

(7) Mechanical Characteristics

An obtained polarizing plate with optical compensation layers was measured for its tensile strength in the same manner as in the (4).

Example 1

(Production of Polycarbonate Resin Film)

Polymerization was performed with a batch polymerization apparatus formed of two vertical reactors each including a stirring blade and a reflux condenser controlled to 100° C. 9,9-[4-(2-Hydroxyethoxy)phenyl]fluorene (BHEPF), isosorbide (ISB), diethylene glycol (DEG), diphenyl carbonate (DPC), and magnesium acetate tetrahydrate were loaded at a molar ratio of BHEPF/ISB/DEG/DPC/magnesium acetate=0.348/0.490/0.162/1.005/1.00×10$^{-5}$. The inside of a first reactor was sufficiently purged with nitrogen (oxygen concentration: 0.0005 vol % to 0.001 vol %), and then heated with a heating medium. When the internal temperature reached 100° C., stirring was started. The internal temperature was caused to reach 220° C. after 40 minutes from the start of the temperature increase, and while the temperature was controlled to be kept at this temperature, pressure reduction was simultaneously started, and the pressure was caused to reach 13.3 kPa in 90 minutes after the internal temperature had reached 220° C. A phenol vapor produced as a by-product along with the polymerization reaction was introduced into the reflux condenser at 100° C., a monomer component contained in a slight amount in the phenol vapor was returned to the first reactor, and a phenol vapor that did not condense was introduced into a condenser at 45° C. and recovered.

Nitrogen was introduced into the first reactor to temporarily return the pressure to the atmospheric pressure. After that, the oligomerized reaction liquid in the first reactor was transferred to a second reactor. Then, temperature increase and pressure reduction in the second reactor were started, and the internal temperature and the pressure were caused to reach 240° C. and 0.2 kPa, respectively in 50 minutes. After that, the polymerization was allowed to proceed until predetermined stirring power was achieved. When the predetermined power was achieved, nitrogen was introduced into the reactor to return the pressure to the atmospheric pressure, and the reaction liquid was extracted in the form of a strand and pelletized with a rotary cutter. Thus, a polycarbonate resin A having a copolymerization composition of BHEPF/ISB/DEG=34.8/49.0/16.2 [mol %] was obtained. The polycarbonate resin had a reduced viscosity of 0.430 dL/g and a glass transition temperature of 128° C.

(Production of First Optical Compensation Layer)

The resultant polycarbonate resin was vacuum-dried at 80° C. for 5 hours, and then a polycarbonate resin film having a thickness of 130 μm was produced using a film-forming apparatus with a single-screw extruder (manufactured by Isuzu Kakoki, screw diameter: 25 mm, cylinder preset temperature: 220° C.), a T-die (width: 900 mm, preset temperature: 220° C.), a chill roll (preset temperature: 125° C.), and a take-up unit. The resultant polycarbonate resin film had a water absorption ratio of 1.2%.

The polycarbonate resin film thus obtained was obliquely stretched by a method in conformity to Example 1 of JP 2014-194483 A to provide a retardation film.

A specific production procedure for the retardation film is as described below. The polycarbonate resin film (thickness: 130 μm, width: 765 mm) was preheated to 142° C. in a preheating zone of the stretching apparatus. In the preheating zone, clip pitches of left and right clips were 125 mm. Next, simultaneously with the entry of the film into a first oblique stretching zone C1, the increase of the clip pitch of the right clips was started, and the clip pitch was increased from 125 mm to 177.5 mm in the first oblique stretching zone C1. A clip pitch change ratio was 1.42. In the first oblique stretching zone C1, with regard to the clip pitch of the left clips, the reduction of the clip pitch was started, and the clip pitch was reduced from 125 mm to 90 mm in the first oblique stretching zone C1. A clip pitch change ratio was 0.72. Further, simultaneously with the entry of the film into a second oblique stretching zone C2, the increase of the clip pitch of the left clips was started, and the clip pitch was increased from 90 mm to 177.5 mm in the second oblique stretching zone C2. Meanwhile, the clip pitch of the right clips was kept at 177.5 mm in the second oblique stretching zone C2. In addition, simultaneously with the oblique stretching, stretching was also performed in a widthwise direction at a ratio of 1.9 times. The oblique stretching was performed at 135° C. Then, in a shrinkage zone, MD shrinkage treatment was performed. Specifically, the clip pitches of both the left clips and the right clips were reduced from 177.5 mm to 165 mm. A shrinkage ratio in the MD shrinkage treatment was 7.0%.

Thus, a retardation film (thickness: 40 μm) was obtained. The resultant retardation film had an Re(550) of 147 nm and an Rth(550) of 167 nm (nx: 1.5977, ny: 1.59404, nz: 1.5935), and showed a refractive index characteristic of nx>ny=nz. In addition, the resultant retardation film had a ratio "Re(450)/Re(550)" of 0.89. The slow axis direction of the retardation film was 45° with respect to the lengthwise direction.

(Production of Second Optical Compensation Layer)

20 Parts by weight of a side chain-type liquid crystal polymer represented by the following chemical formula (I) (numerical values "65" and "35" in the formula each represent the mole percent of a monomer unit, and the polymer is represented in the form of a block polymer for convenience: weight-average molecular weight: 5,000), 80 parts by weight of a polymerizable liquid crystal showing a nematic liquid crystal phase (manufactured by BASF SE: product name: Paliocolor LC242), and 5 parts by weight of a photopolymerization initiator (manufactured by Ciba Specialty Chemicals Inc.: product name: IRGACURE 907) were dissolved in 200 parts by weight of cyclopentanone to prepare a liquid crystal application liquid. Then, the application liquid was applied onto a substrate film (norbornene-based resin film: manufactured by Zeon Corporation, product name: "ZEONEX") with a bar coater, and was then dried by heating at 80° C. for 4 minutes to align the liquid crystal. The liquid crystal layer was cured by irradiating the liquid crystal layer with UV light. Thus, a liquid crystal fixed layer (thickness: 1.10 μm) serving as a second optical compensation layer was formed on the substrate. The layer had an Re(550) of 0 nm and an Rth(550) of −135 nm (nx: 1.5723, ny: 1.5723, nz: 1.5757), and showed a refractive index characteristic of nz>nx=ny.

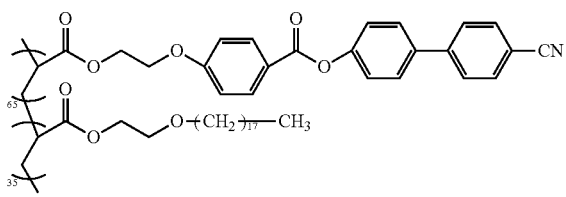

(I)

(Production of Laminate)

Onto the retardation film (first optical compensation layer), through the intermediation of an acrylic pressure-sensitive adhesive, the liquid crystal fixed layer (second optical compensation layer) was bonded by a roll-to-roll process, and then the substrate film was removed. Thus, a laminate of the retardation film and the liquid crystal fixed layer transferred thereinto was obtained.

The resultant laminate had an Re(550) of 147 nm and an Rth(550) of 32 nm.

(Production of Polarizer)

An elongate roll of a polyvinyl alcohol (PVA)-based resin film having a thickness of 30 μm (manufactured by Kuraray Co., Ltd., product name: "PE3000") was uniaxially stretched in an elongate direction with a roll stretching machine at a ratio of 5.9 times in the elongate direction, and at the same time, was subjected to swelling, dyeing, cross-linking, and washing treatments, followed finally by drying treatment. Thus, a polarizer having a thickness of 12 μm was produced.

Specifically, in the swelling treatment, the film was stretched at a ratio of 2.2 times while being treated with pure water at 20° C. Then, in the dyeing treatment, the film was stretched at a ratio of 1.4 times while being treated in an aqueous solution at 30° C. containing iodine and potassium iodide at a weight ratio of 1:7, whose iodine concentration had been adjusted so that the polarizer to be obtained had a single layer transmittance of 45.0%. Further, two-stage cross-linking treatment was adopted for the cross-linking treatment. In the first-stage cross-linking treatment, the film was stretched at a ratio of 1.2 times while being treated in an aqueous solution at 40° C. having dissolved therein boric acid and potassium iodide. The boric acid content and potassium iodide content of the aqueous solution of the first-stage cross-linking treatment were set to 5.0 wt % and 3.0 wt %, respectively. In the second-stage cross-linking treatment, the film was stretched at a ratio of 1.6 times while being treated in an aqueous solution at 65° C. having dissolved therein boric acid and potassium iodide. The boric acid content and potassium iodide content of the aqueous solution of the second-stage cross-linking treatment were set to 4.3 wt % and 5.0 wt %, respectively. In addition, in the washing treatment, the film was treated in an aqueous solution of potassium iodide at 20° C. The potassium iodide content of the aqueous solution of the washing treatment was set to 2.6 wt %. Finally, the film was dried at a drying treatment of 70° C. for 5 minutes. Thus, the polarizer was obtained.

(Production of Optically Anisotropic Layer)

A commercially available triacetylcellulose (TAC) film having an elongate roll shape (thickness: 25 μm) was used as it was. The film had an Re(550) of 0 nm and an Rth(550) of 55 nm. In addition, the film had a tensile strength of 120 N/mm$^2$ and an arithmetic average roughness Ra of 0.05 μm.

(Production of Polarizing Plate)

Onto both surfaces of the polarizer, through the intermediation of a polyvinyl alcohol-based adhesive, the optically anisotropic layer and a HC-TAC film having a hard coat (HC) layer formed on one surface of a TAC film by hard coat treatment (thickness: 32 μm, corresponding to a protective layer) were respectively bonded by a roll-to-roll process. Thus, an elongate polarizing plate having a configuration of "protective layer/polarizer/optically anisotropic layer" was obtained.

(Production of Polarizing Plate With Optical Compensation Layers)

The optically anisotropic layer surface of the polarizing plate obtained in the foregoing and the first optical compensation layer surface of the laminate of "first optical compensation layer/second optical compensation layer" obtained in the foregoing were bonded onto each other through the intermediation of an acrylic pressure-sensitive adhesive by a roll-to-roll process. Thus, an elongate polarizing plate with optical compensation layers having a configuration of "protective layer/polarizer/optically anisotropic layer/first optical compensation layer/second optical compensation layer" was obtained. The mechanical characteristic (tensile strength) of the resultant polarizing plate with optical compensation layers was measured by the procedure of the (7), and as a result, a characteristic satisfactory for practical use was shown.

(Production of Organic EL Panel)

A pressure-sensitive adhesive layer was formed on the second optical compensation layer side of the resultant polarizing plate with optical compensation layers through the use of an acrylic pressure-sensitive adhesive, and the resultant was cut into dimensions of 50 mm×50 mm.

A smartphone manufactured by Samsung Electronics Co., Ltd. (Galaxy-S5) was disassembled to remove its organic EL panel. A polarizing film bonded onto the organic EL panel was peeled off, and the polarizing plate with optical compensation layers cut in the foregoing was bonded in place of the polarizing film to provide an organic EL panel.

The reflection characteristics of the resultant organic EL panel were measured by the procedure of the (6). As a result, it was found that a neutral reflection hue was achieved in each of the front direction and the oblique direction. In addition, the result of the viewing angle characteristic is shown in Table 1.

TABLE 1

| | Optically anisotropic layer | | | | | First optical compensation layer | Second optical compensation layer | Laminate | | Viewing angle characteristic |
| | Refractive index characteristic | Material | Tensile strength | R0 | Rth | Refractive index characteristic | Refractive index characteristic | R0 | Rth | |
|---|---|---|---|---|---|---|---|---|---|---|
| Example 1 | nx = ny > nz | Cellulose ester | 120 | 0 | 55 | nx > ny > nz | nz > nx = ny | 147 | 32 | 0.08 |
| Example 2 | nx = ny > nz | Cellulose ester | 120 | 0 | 17 | nx > ny > nz | nz > nx = ny | 147 | 32 | 0.09 |
| Example 3 | nx = ny > nz | Cellulose ester | 120 | 0 | 100 | nx > ny > nz | nz > nx = ny | 147 | −3 | 0.12 |
| Example 4 | nx = ny > nz | Cellulose ester | 120 | 0 | 17 | nx > ny > nz | nz > nx = ny | 120 | 37 | 0.08 |

TABLE 1-continued

| | Optically anisotropic layer | | | | | First optical compensation layer Refractive index characteristic | Second optical compensation layer Refractive index characteristic | Laminate | | Viewing angle characteristic |
|---|---|---|---|---|---|---|---|---|---|---|
| | Refractive index characteristic | Material | Tensile strength | RO | Rth | | | R0 | Rth | |
| Example 5 | nx = ny > nz | Cellulose ester | 120 | 0 | 17 | nx > ny > nz | nz > nx = ny | 160 | 52 | 0.04 |
| Example 6 | nx = ny > nz | Cellulose ester | 120 | 20 | 100 | nx > ny > nz | nz > nx = ny | 147 | −2 | 0.12 |
| Example 8 | nx = ny > nz | Cellulose ester | 120 | 20 | 100 | nx > ny > nz | nz > nx = ny | 147 | −3 | 0.11 |
| Example 9 | nx = ny > nz | Cellulose ester | 120 | 0 | 80 | nx > ny > nz | nz > nx = ny | 147 | 32 | 0.1 |
| Example 10 | nx > ny > nz | Cellulose ester | 120 | 0 | 17 | nx > ny > nz | nz > nx = ny | 120 | −33 | 0.12 |
| Example 11 | nx > ny > nz | Cellulose ester | 120 | 20 | 100 | nx > ny > nz | nz > nx = ny | 147 | −50 | 0.14 |
| Comparative Example 1 | nx > ny > nz | Cellulose ester | 120 | 20 | 100 | nx > ny > nz | nz > nx = ny | 147 | −103 | 0.19 |
| Comparative Example 2 | nx = ny > nz | Cellulose ester | 120 | 20 | 100 | nx > ny > nz | nz > nx = ny | 147 | −63 | 0.15 |
| Comparative Example 3 | nx = ny > nz | Cellulose ester | 120 | 0 | 55 | nx > ny > nz | nz > nx = ny | 147 | 87 | 0.18 |
| Comparative Example 4 | nx = ny > nz | Cellulose ester | 120 | 0 | 55 | nx > ny > nz | nz > nx = ny | 110 | 55 | 0.16 |
| Comparative Example 5 | Isotropic | Acrylic | 90 | 0 | 0 | nx > ny > nz | nz > nx = ny | 147 | 32 | 0.08 |
| Comparative Example 6 | nx = ny > nz | Cellulose ester | 120 | 0 | 120 | nx > ny > nz | nz > nx = ny | 147 | 32 | 0.25 |

Examples 2 to 11 and Comparative Examples 1 to 6

Polarizing plates with optical compensation layers and organic EL panels were produced so as to have configurations shown in Table 1. The resultant polarizing plates with optical compensation layers and organic EL panels were subjected to the same evaluations as those in Example 1. As shown in Table 1, the viewing angle characteristic of the organic EL panel of each of Examples 2 to 11 was satisfactory, whereas the viewing angle characteristic of the organic EL panel of each of Comparative Examples 1 to 4 and 6 was insufficient. The polarizing plate with optical compensation layers of each of Examples 2 to 11, and Comparative Examples 1 to 4 and 6 showed, as the mechanical characteristic (tensile strength), a characteristic satisfactory for practical use. The viewing angle characteristic of the organic EL panel of Comparative Example 5 was satisfactory, but the mechanical characteristic (tensile strength) of the polarizing plate with optical compensation layers of Comparative Example 5 was insufficient for practical use.

INDUSTRIAL APPLICABILITY

The polarizing plate with optical compensation layers of the present invention is suitably used in an organic EL panel.

REFERENCE SIGNS LIST 10 polarizer
20 optically anisotropic layer
30 first optical compensation layer
40 second optical compensation layer
100 polarizing plate with optical compensation layers

The invention claimed is:

1. A polarizing plate with optical compensation layers, comprising in this order:
a polarizer;
an optically anisotropic layer;
a first optical compensation layer; and
a second optical compensation layer, wherein:
the optically anisotropic layer shows a refractive index characteristic of nx>ny>nz, and has an Re(550) of from 0 nm to 20 nm and an Rth(550) of from 5 nm to 100 nm;
the first optical compensation layer shows a refractive index characteristic of nx>ny>nz, and satisfies a relationship of Re(450)<Re(550);
the second optical compensation layer shows a refractive index characteristic of nz>nx>ny;
a laminate of the first optical compensation layer and the second optical compensation layer has an Re(550) of from 120 nm to 160 nm and an Rth(550) of from −50 nm to 80 nm; and
the polarizing plate with optical compensation layers is used for an organic EL panel,
where Re(450) represents an in-plane retardation measured with light having a wavelength of 450 nm at 23° C., Re(550) represents an in-plane retardation measured with light having a wavelength of 550 nm at 23° C., and Rth(550) represents a thickness direction retardation measured with light having a wavelength of 550 nm at 23° C.

2. The polarizing plate with optical compensation layers according to claim 1, wherein the optically anisotropic layer has a tensile strength of from 100 N/mm² to 300 N/mm².

3. The polarizing plate with optical compensation layers according to claim 1, wherein an angle formed by an absorption axis of the polarizer and a slow axis of the first optical compensation layer is from 35° to 55°.

4. The polarizing plate with optical compensation layers according to claim 1, wherein the first optical compensation layer comprises a retardation film obtained by oblique stretching.

5. The polarizing plate with optical compensation layers according to claim 1, further comprising a conductive layer and a substrate in the stated order on an opposite side of the second optical compensation layer to the first optical compensation layer.

6. An organic EL panel, comprising the polarizing plate with optical compensation layers of claim 1.

7. The polarizing plate with optical compensation layers according to claim 2, wherein an angle formed by an absorption axis of the polarizer and a slow axis of the first optical compensation layer is from 35° to 55°.

8. The polarizing plate with optical compensation layers according to claim 2, wherein the first optical compensation layer comprises a retardation film obtained by oblique stretching.

9. The polarizing plate with optical compensation layers according to claim 3, wherein the first optical compensation layer comprises a retardation film obtained by oblique stretching.

10. The polarizing plate with optical compensation layers according to claim 2, further comprising a conductive layer and a substrate in the stated order on an opposite side of the second optical compensation layer to the first optical compensation layer.

11. The polarizing plate with optical compensation layers according to claim 3, further comprising a conductive layer and a substrate in the stated order on an opposite side of the second optical compensation layer to the first optical compensation layer.

12. The polarizing plate with optical compensation layers according to claim 4, further comprising a conductive layer and a substrate in the stated order on an opposite side of the second optical compensation layer to the first optical compensation layer.

13. An organic EL panel, comprising the polarizing plate with optical compensation layers of claim 2.

14. An organic EL panel, comprising the polarizing plate with optical compensation layers of claim 3.

15. An organic EL panel, comprising the polarizing plate with optical compensation layers of claim 4.

16. An organic EL panel, comprising the polarizing plate with optical compensation layers of claim 5.

17. The polarizing plate with optical compensation layers according to claim 1, wherein the optically anisotropic layer has an Re(550) of 0 nm to 15 nm and an Rth(550) of 5 nm to 60 nm.

18. The polarizing plate with optical compensation layers according to claim 1, wherein the optically anisotropic layer has an Re(550) of 10 nm to 20 nm and an Rth(550) of 30 nm to 70 nm.

19. The polarizing plate with optical compensation layers according to claim 1, wherein the optically anisotropic layer has an Re(550) of 0 nm to 10 nm and an Rth(550) of 10 nm to 20 nm.

20. The polarizing plate with optical compensation layers according to claim 1, wherein the optically anisotropic layer has an Re(550) of 15 nm to 20 nm and an Rth(550) of 35 nm to 50 nm.

* * * * *